United States Patent
Paulson

(10) Patent No.: US 9,328,016 B2
(45) Date of Patent: May 3, 2016

(54) SURFACE-MODIFIED GLASS SUBSTRATE

(71) Applicant: CORNING INCORPORATED, Corning, NY (US)

(72) Inventor: Charles Andrew Paulson, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 407 days.

(21) Appl. No.: 14/043,282

(22) Filed: Oct. 1, 2013

(65) Prior Publication Data

US 2014/0090864 A1   Apr. 3, 2014

Related U.S. Application Data

(60) Provisional application No. 61/709,339, filed on Oct. 3, 2012.

(51) Int. Cl.
| | | |
|---|---|---|
| *C03C 17/00* | (2006.01) | |
| *H05K 5/00* | (2006.01) | |
| *C03C 17/22* | (2006.01) | |
| *B32B 17/06* | (2006.01) | |
| *C03C 21/00* | (2006.01) | |

(52) U.S. Cl.
CPC .............. *C03C 17/225* (2013.01); *B32B 17/06* (2013.01); *C03C 21/002* (2013.01); *H05K 5/0004* (2013.01); *B32B 2307/536* (2013.01); *C03C 2217/213* (2013.01); *C03C 2217/281* (2013.01); *C03C 2218/156* (2013.01); *Y10T 428/265* (2015.01); *Y10T 428/266* (2015.01); *Y10T 428/30* (2015.01)

(58) Field of Classification Search
None
See application file for complete search history.

(56) References Cited

U.S. PATENT DOCUMENTS

| | | | | |
|---|---|---|---|---|
| 4,504,519 A | * | 3/1985 | Zelez | C03C 17/22 204/173 |
| 5,399,387 A | * | 3/1995 | Law | C03C 17/225 427/166 |
| 6,338,901 B1 | * | 1/2002 | Veerasamy | B05D 5/083 428/336 |
| 2005/0287309 A1 | * | 12/2005 | Veerasamy | C03C 17/3435 427/595 |
| 2006/0008654 A1 | * | 1/2006 | Veerasamy | B32B 17/10036 428/432 |
| 2006/0008655 A1 | * | 1/2006 | Butz | B32B 17/10036 428/433 |
| 2010/0304090 A1 | * | 12/2010 | Henn | C03C 17/002 428/172 |
| 2011/0157703 A1 | * | 6/2011 | Broadway | C03C 17/3435 359/586 |
| 2012/0057236 A1 | * | 3/2012 | Broadway | C03C 17/3435 359/586 |
| 2012/0171444 A1 | * | 7/2012 | Haruta et al. | 428/217 |

(Continued)

FOREIGN PATENT DOCUMENTS

| | | | | |
|---|---|---|---|---|
| EP | 2363383 | * | 7/2011 | 17/34 |
| EP | 2492090 | * | 7/2011 | 17/10 |

OTHER PUBLICATIONS

Gy, "Ion exchange for glass strengthening," Materials Science and Engineering B 149 (2008) 159-165.*

(Continued)

*Primary Examiner* — David Sample
(74) *Attorney, Agent, or Firm* — Payal A. Patel

(57) ABSTRACT

Scratch-resistant glass substrates including a hard, scratch-resistant layer over a major surface of the substrate are disclosed. The layer may exhibit a hardness, as measured using a Berkovich indenter, of at least 10 GPa and an x-ray amorphous structure along at least a portion of the thickness of the layer. The layer may optionally exhibit an optical transparency of at least 70% and/or a compressive stress of at least 10 MPa.

23 Claims, 6 Drawing Sheets

(56) References Cited

U.S. PATENT DOCUMENTS

2012/0198888 A1* 8/2012 Hasegawa ............ C03C 17/007 65/17.2
2012/0251773 A1* 10/2012 Krasnov ................ C03C 15/00 428/141
2013/0058640 A1* 3/2013 Taki .................... C23C 14/0605 396/531
2014/0116329 A1† 5/2014 Chaudhari

OTHER PUBLICATIONS

Patent Cooperation Treaty International Notification of Transmittal of the International Search Report and The Written Opinion of the International Searching Authority, international application No. PCT/US2013/062828; mailing date Sep. 12, 2013, 10 pages.*

\* cited by examiner
† cited by third party

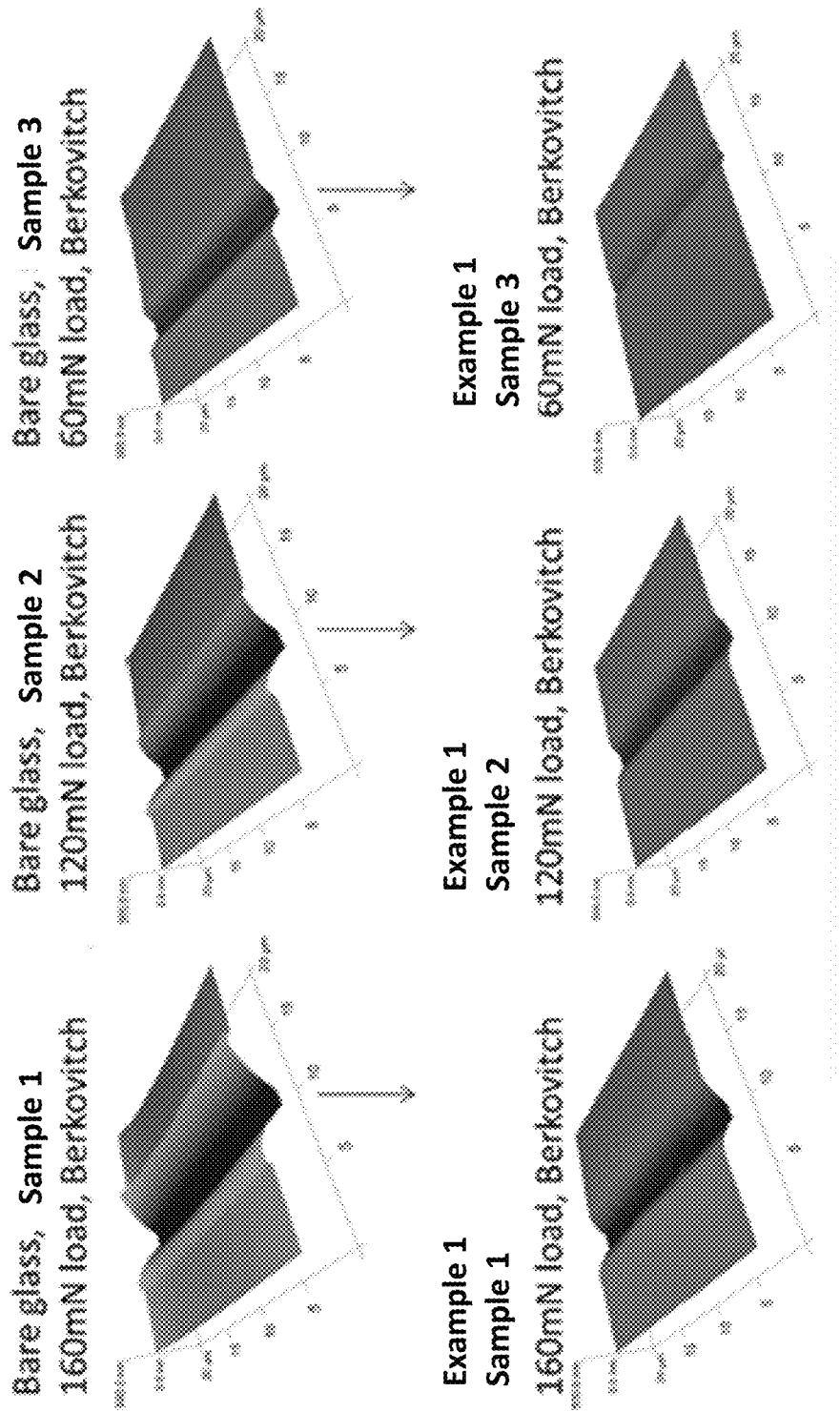

SURFACE-MODIFIED GLASS SUBSTRATE

CROSS-REFERENCE TO RELATED APPLICATIONS

This application claims the benefit of priority under 35 U.S.C. §119 of U.S. Provisional Application Ser. No. 61/709,339 filed on Oct. 3, 2012, the content of which is relied upon and incorporated herein by reference in its entirety.

BACKGROUND

The present disclosure relates generally to surface-modified glass substrates, and more particularly to glass substrates having a scratch-resistant layer provided over a major surface of the substrate.

Scratches are a concern for glass cover applications in hand held devices and other devices such as monitors and other displays. Scratches increase the scattering of light and can reduce the brightness and contrast of images and text that is presented on such screens. Further, in the device-off state, scratches can make the display look hazy, marred and unattractive. In particular for displays and handheld devices, scratch resistance can be an important attribute.

Scratches can be characterized by their depth as well as their width. Deep scratches extend at least 2 microns into the surface of the material, and wide scratches are more than 2 microns wide. Due to the physical extent of the scratch, fragmentation or chipping typically accompanies deep and/or wide scratches. In brittle solids, though, such as glass substrates, the resistance to deep and wide scratches can be improved through optimization of glass chemistry, i.e., glass composition.

On the other hand, scratches can also be shallow and/or narrow. Shallow scratches are characterized by a depth of less than 2 microns, and narrow scratches are characterized by a width of less than 2 microns. Scratches at these dimensional scales are sometimes described as "microductile" scratches. In displays and handheld devices, where a glass cover can be formed from an oxide glass, a large fraction of the scratches accumulated during use are believed to be microductile scratches. Though microductile scratches are not typically associated with large volumes of fragmented or chipped material, microductile scratches can adversely affect the optical properties of a glass cover. Further, in contrast to the larger, "heavy" scratches, microductile scratches are not easily prevented through modification of the glass chemistry.

The formation of microductile scratches can be attenuated by adjusting the hardness of the surface that is being scratched. Harder surfaces typically are more resistant to microductile scratching. While oxide glasses that form the glass substrates used in many glass covers typically have hardness values in the range of 6 to 9 GPa, as disclosed herein, the propensity of microductile scratch formation can be dramatically decreased by forming a harder surface layer on the oxide glass.

In view of the foregoing, it would be desirable to provide a hard, optically-transparent, scratch-resistant layer that can be applied to rigid glass covers that is economical, and physically and chemically compatible with the underlying glass.

SUMMARY

Disclosed herein is glass substrate having a modified surface. The glass substrate includes a glass main body having opposing major surfaces, and a layer provided over a majority of a first major surface. Attributes of at least a portion of the layer include a Berkovich indenter hardness of at least 10 GPa (or a hardness as measured using a Berkovich indenter) and an x-ray amorphous structure, and optionally, an optical transparency of at least 70% and/or a compressive stress of at least 10 MPa.

The glass substrate can be used as cover glass or as part of the housing for an electronic device where the layer is provided as the outward-facing layer. For instance, in an electronic device housing, the glass substrate can form at least part of (a) a front glass cover that is placed and secured to provide a front surface for the electronic device enclosure, and/or (b) a back glass cover that is placed and secured to provide a back surface for the electronic device enclosure. One or both of the front glass cover and the back glass cover can also be shaped to extend to a side of the housing to provide a side surface for the enclosure.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

BRIEF DESCRIPTION OF THE DRAWINGS

FIG. 6 illustrates the scratch depth and width reduction of glass substrates according to one or more embodiments in comparison to bare glass main bodies.

DETAILED DESCRIPTION

A glass article comprises a glass main body having opposing major surfaces, and an layer provided over a majority of a first major surface. The layer, which may provide scratch-resistance to the underlying glass, has a Berkovich indenter hardness of at least 10 GPa and an x-ray amorphous structure along at least a portion of its thickness. The layer may optionally also include an optical transparency of at least 70% and/or a compressive stress of at least 10 MPa.

Figure 1:
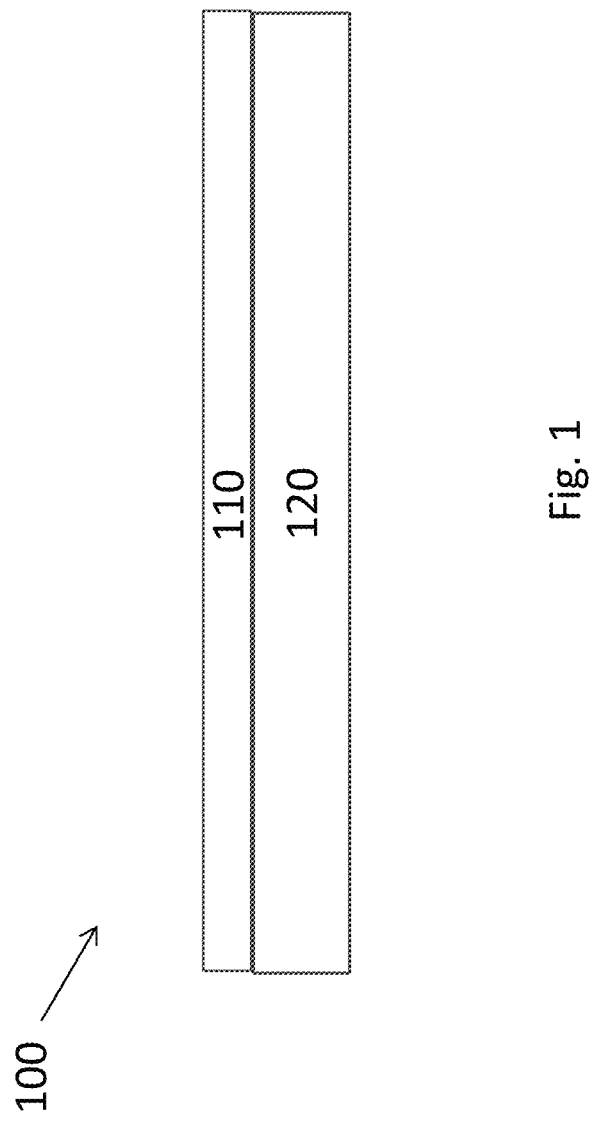
FIG. 1 is a schematic of an layer provided over a major surface of a glass substrate.

The layer may comprise an optically-transparent hard coat that imparts scratch-resistance to the glass substrate. In embodiments, the glass substrate comprises chemically-strengthened glass. The layer can substantially enhance the scratch resistance of a surface of the substrate while maintaining the overall optical clarity of the glass. A scratch-resistant glass substrate 100 comprising a layer 110 provided over a major surface of a glass main body 120 is shown schematically in FIG. 1.

The glass substrate itself may be provided using a variety of different processes. For instance, example glass substrate forming methods include float processes and down-draw processes such as fusion draw, slot draw and roll forming.

In the float glass process, a glass substrate that may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass substrate that can be lifted from the tin onto rollers. Once off the bath, the glass substrate can be cooled further and annealed to reduce internal stress.

Down-draw processes produce glass substrates having a uniform thickness that possess relatively pristine surfaces. Because the average flexural strength of the glass substrate is controlled by the amount and size of surface flaws, a pristine surface that has had minimal contact has a higher initial strength. When this high strength glass substrate is then further strengthened (e.g., chemically), the resultant strength can be higher than that of a glass substrate with a surface that has been lapped and polished. Down-drawn glass substrates may be drawn to a thickness of less than about 2 mm. In addition, down drawn glass substrates have a very flat, smooth surface that can be used in its final application without costly grinding and polishing.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass substrate. The fusion draw method offers the advantage that, because the two glass films flowing over the channel fuse together, neither of the outside surfaces of the resulting glass substrate comes in contact with any part of the apparatus. Thus, the surface properties of the fusion drawn glass substrate are not affected by such contact.

The slot draw process is distinct from the fusion draw method. In slow draw processes, the molten raw material glass is provided to a drawing tank. The bottom of the drawing tank has an open slot with a nozzle that extends the length of the slot. The molten glass flows through the slot/nozzle and is drawn downward as a continuous substrate and into an annealing region.

In some embodiments, the glass substrate used in the glass substrate 120 may be batched with 0-2 mol. % of at least one fining agent selected from a group that includes Na2SO4, NaCl, NaF, NaBr, K2SO4, KCl, KF, KBr, and SnO2.

Once formed, glass substrates may be chemically strengthened by an ion exchange process. In this process, typically by immersion of the glass substrate into a molten salt bath for a predetermined period of time, ions at or near the surface of the glass are exchanged for larger metal ions from the salt bath. In one embodiment, the temperature of the molten salt bath is about 400° C. to about 430° C. and the predetermined time period is about four to about eight hours. The incorporation of the larger ions into the glass strengthens the substrate by creating a compressive stress in a near surface region. A corresponding tensile stress is induced within a central region of the glass to balance the compressive stress.

In one example embodiment, sodium ions in the chemically-strengthened glass can be replaced by potassium ions from the molten bath, though other alkali metal ions having larger atomic radii, such as rubidium or cesium, can replace smaller alkali metal ions in the glass. According to particular embodiments, smaller alkali metal ions in the glass can be replaced by $Ag^+$ ions. Similarly, other alkali metal salts such as, but not limited to, sulfates, halides, and the like may be used in the ion exchange process.

The replacement of smaller ions by larger ions at a temperature below that at which the glass network can relax produces a distribution of ions across the surface of the glass that results in a stress profile. The larger volume of the incoming ion produces a compressive stress (CS) on the surface and tension (central tension, or CT) in the center of the glass. The compressive stress is related to the central tension by the following relationship:

$$CS = CT\left(\frac{t - 2DOL}{DOL}\right)$$

where t is the total thickness of the glass sheet and DOL is the depth of exchange, also referred to as depth of layer.

In one embodiment, a chemically-strengthened glass sheet can have a surface compressive stress of at least 300 MPa, e.g., at least 400, 450, 500, 550, 600, 650, 700, 750 or 800 MPa, a depth of layer at least about 20 μm (e.g., at least about 20, 25, 30, 35, 40, 45, or 50 μm) and/or a central tension greater than 40 MPa (e.g., greater than 40, 45, or 50 MPa) but less than 100 MPa (e.g., less than 100, 95, 90, 85, 80, 75, 70, 65, 60, or 55 MPa).

Example ion-exchangeable glasses that may be used as the glass substrate are alkali aluminosilicate glasses or alkali aluminoborosilicate glasses, though other glass compositions are contemplated. As used herein, "ion exchangeable" means that a glass is capable of exchanging cations located at or near the surface of the glass with cations of the same valence that are either larger or smaller in size. One example glass composition comprises $SiO_2$, $B_2O_3$ and $Na_2O$, where ($SiO_2$+$B_2O_3$)≥66 mol. %, and $Na_2O$≥9 mol. %. In an embodiment, the glass substrate includes at least 6 wt. % aluminum oxide. In a further embodiment, a glass substrate includes one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass substrate can comprise 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the glass substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. %≤($Li_2O$+$Na_2O$+$K_2O$)≤20 mol. % and 0 mol. %≤(MgO+CaO)≤10 mol. %.

A still further example glass composition comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % ($Li_2O+Na_2O+K_2O$)≤18 mol. % and 2 mol. %≤($MgO+CaO$)≤7 mol. %.

In a particular embodiment, an alkali aluminosilicate glass comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $$\frac{Al_2O_3 + B_2O_3}{\sum \text{modifiers}} > 1,$$

where in the ratio the components are expressed in mol. % and the modifiers are alkali metal oxides. This glass, in particular embodiments, comprises, consists essentially of, or consists of: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $$\frac{Al_2O_3 + B_2O_3}{\sum \text{modifiers}} > 1.$$

In another embodiment, an alkali aluminosilicate glass comprises, consists essentially of, or consists of: 61-75 mol. % $SiO_2$; 7-15 mol. % $Al_2O_3$; 0-12 mol. % $B_2O_3$; 9-21 mol. % $Na_2O$; 0-4 mol. % $K_2O$; 0-7 mol. % $MgO$; and 0-3 mol. % $CaO$.

In yet another embodiment, an alkali aluminosilicate glass substrate comprises, consists essentially of, or consists of: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % $MgO$; 0-10 mol. % $CaO$; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; wherein 12 mol. %≤$Li_2O+Na_2O+K_2O$≤20 mol. % and 0 mol. %≤$MgO+CaO$≤10 mol. %.

In still another embodiment, an alkali aluminosilicate glass comprises, consists essentially of, or consists of: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % $MgO$; and 0-5 mol. % $CaO$, wherein: 66 mol. %≤$SiO_2+B_2O_3+CaO$≤69 mol. %; $Na_2O+K_2O+B_2O_3+MgO+CaO+SrO$>10 mol. %; 5 mol. %≤$MgO+CaO+SrO$≤8 mol. %; ($Na_2O+B_2O_3$)−$Al_2O_3$≤2 mol. %; 2 mol. %≤$Na_2O$−$Al_2O_3$≤6 mol. %; and 4 mol. %≤($Na_2O+K_2O$)−$Al_2O_3$≤10 mol. %.

The glass substrate can have a thickness ranging from about 100 microns to 5 mm. Example substrate thicknesses range from 100 microns to 500 microns, e.g., 100, 200, 300, 400 or 500 microns. Further example substrate thicknesses range from 500 microns to 1000 microns, e.g., 500, 600, 700, 800, 900 or 1000 microns. The glass substrate may have a thickness greater than 1 mm, e.g., about 2, 3, 4, or 5 mm.

The layer may be a transferred layer or a thin film that is deposited in situ. A transferred layer may be provided by a layer transfer process that generally involves cleaving a source wafer (e.g., $Al_2O_3$) along a cleavage plane that is defined by ion implantation into the source wafer. Typically, hydrogen is used as the ion implantation species. An advantage of the layer transfer process is that the hydrogen implant-induced delamination can be repeated many times, so that many layers can be harvested from an initial free-standing wafer. The harvested layer can be bonded to a surface of the glass substrate.

In further embodiments, the layer can be formed by chemical vapor deposition (e.g., plasma enhanced chemical vapor deposition), physical vapor deposition (e.g., sputter deposition or laser ablation) or thermal evaporation of a suitable starting material directly onto a glass substrate or onto a previously surface-modified glass substrate.

Sputtering processes may include reactive sputtering or non-reactive sputtering. A single-chamber sputter deposition apparatus 200 for forming such layers is illustrated schematically in FIG. 2. The apparatus 200 includes a vacuum chamber 205 having a substrate stage 210 onto which one or more glass substrates 212 can be mounted, and a mask stage 220, which can be used to mount shadow masks 222 for patterned deposition of a layer onto a defined region of a substrate. The chamber 205 is equipped with a vacuum port 240 for controlling the interior pressure, as well as a water cooling port 250 and a gas inlet port 260. The vacuum chamber can be cryo-pumped (CTI-8200/Helix; MA, USA) and is capable of operating at pressures suitable for both evaporation processes (~$10^{-6}$ Torr) and RF sputter deposition processes (~$10^{-3}$ Torr).

Figure 2:
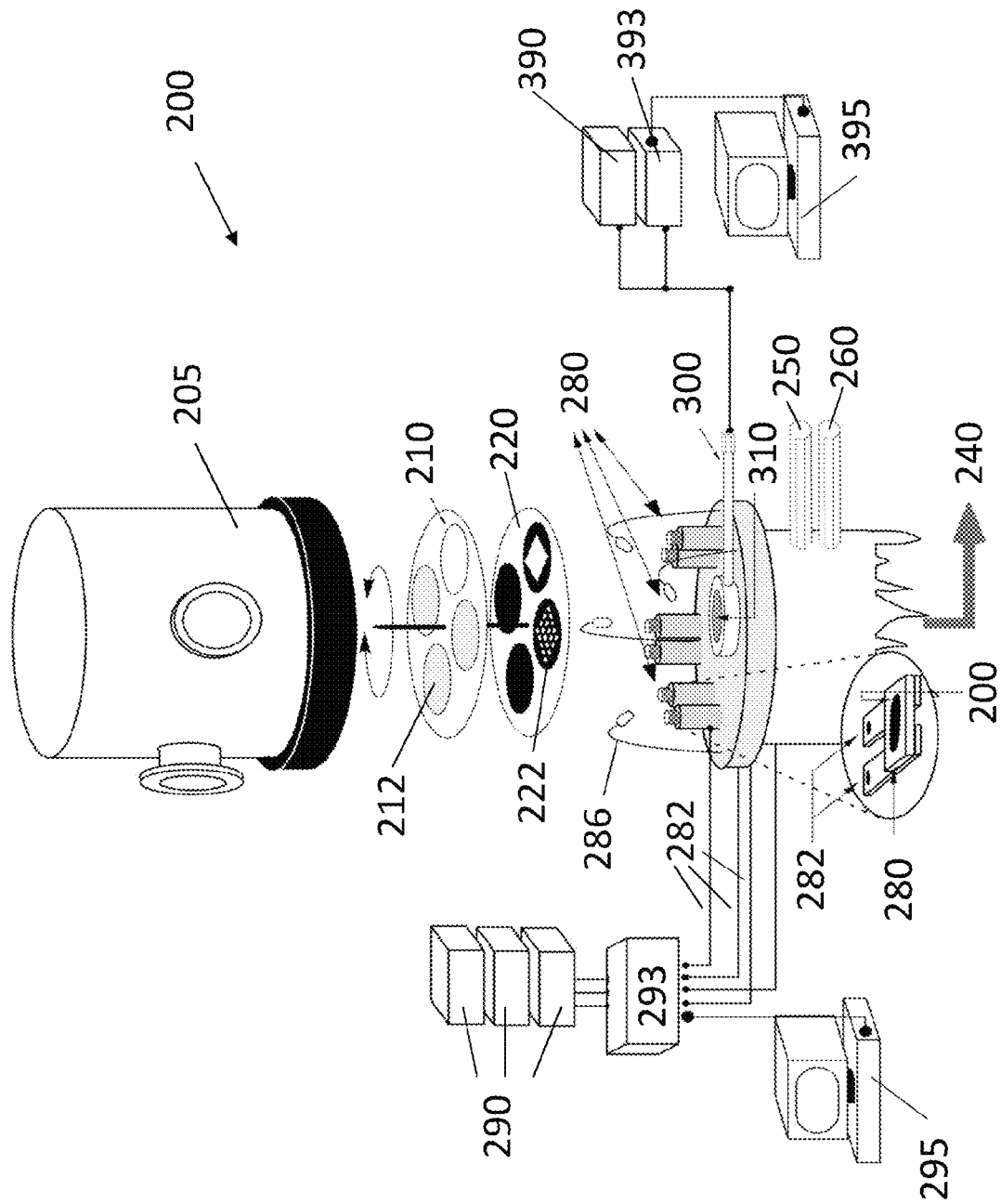
FIG. 2 is a schematic diagram of a single chamber sputter tool for forming layers on glass substrates according to some embodiments.

As shown in FIG. 2, multiple evaporation fixtures 280, each having an optional corresponding shadow mask 222 for evaporating material onto a glass substrate 212 are connected via conductive leads 282 to a respective power supply 290. A starting material 200 to be evaporated can be placed into each fixture 280. Thickness monitors 286 can be integrated into a feedback control loop including a controller 293 and a control station 295 in order to affect control of the amount of material deposited.

In an example system, each of the evaporation fixtures 280 are outfitted with a pair of copper leads 282 to provide DC current at an operational power of about 80-180 Watts. The effective fixture resistance will generally be a function of its geometry, which will determine the precise current and wattage.

An RF sputter gun 300 having a sputter target 310 is also provided for forming a layer of material (e.g., metal oxide, nitride, carbide or boride) on a glass substrate. The RF sputter gun 300 is connected to a control station 395 via an RF power supply 390 and feedback controller 393. To form the layer by sputtering, a water-cooled cylindrical RF sputtering gun (Onyx-3™, Angstrom Sciences, Pa) can be positioned within the chamber 105. Suitable RF deposition conditions include 50-150 W forward power (<1 W reflected power), which corresponds to a typical deposition rate of about ~5 Å/second (Advanced Energy, Co, USA). In embodiments, the sputtering rate can vary between 0.1 and 10 angstroms per second, for example.

In embodiments where the glass substrate is a chemically-strengthened glass substrate, in order to not adversely affect the stress profile within the substrate, the act of forming a layer over a surface of the substrate comprises heating the glass substrate to a maximum temperature of 500° C. The temperature of the substrate during the act of forming the layer can range from about −200° C. to 500° C. In embodiments, the substrate temperature is maintained at a temperature between about room temperature and 500° C., e.g., at a temperature of less than 500° C. or less than 300° C. during the formation of the layer.

The layer (transferred layer or deposited layer) may be characterized by its chemical, mechanical and/or optical properties. According to various embodiments, a scratch-resistant glass substrate may possess an array of properties, which may include low weight, high impact resistance, and high optical transparency. Compositionally, the layer may comprise a metal oxide layer, a metal nitride layer, a metal carbide layer, a metal boride layer or a diamond-like carbon layer. Example metals for such an oxide, nitride, carbide or boride layer include boron, aluminum, silicon, titanium, vanadium, chromium, yttrium, zirconium, niobium, molybdenum, tin, hafnium, tantalum and tungsten. The layer can comprise an inorganic material. Non-limiting example inorganic layers include aluminum oxide and zirconium oxide layers.

The layer may comprise a stoichiometric composition (e.g., $Al_2O_3$) or a non-stoichiometric composition (e.g., $Al_2O_{3-x}$, $0.05<x<0.3$). Further, compound oxides comprising two or more metal additions may be used. For instance, an overall composition of an layer may include, in addition to a base oxide such as alumina, 5-40 wt. % of an alkaline earth oxide such as CaO or MgO.

In embodiments the layer is suitably adhered to the underlying glass substrate so as to not delaminate or peel during use. In embodiments where the layer is in direct physical contact with the glass substrate, the adhesion between the layer and the glass substrate can be characterized by an interfacial energy in the range of 10 to 100 $J/m^2$ or more, e.g., greater than 100 or 150 $J/m^2$.

One attribute of the layer can be chemical resistance. As an outward-facing layer, insolubility of the layer in common solvents such as water, salt water, ammonia, isopropyl alcohol, methanol, acetone and other commercial cleaning solutions can extend the durability and lifetime of the layer. It may also be beneficial if the layer is resistant to degradation due to exposure to ambient lighting including ultra-violet light. In embodiments, the layer exhibits no appreciable yellowing due to light exposure after 1000 hr or after 10000 hr.

A thickness of the layer can range from 10 nm to 2 microns. For example, the average layer thickness can be about 10, 20, 50, 100, 200, 300, 400, 500, 600, 700, 800, 900, 1000, 1500 or 2000 nm. In embodiments, a thickness of the layer can range from 50 to 200 nm. For instance, transferred layers that are between about 100 and 200 nm thick may have a mechanical compliance that is suitable for the transfer process and amenable to bonding to the glass substrate. For single crystal (i.e., layer-transferred) layers, a dislocation density within the crystalline material can be less than $10^8/cm^2$, i.e., between about $10^5$ and $10^8/cm^2$.

The layer can have a hardness that is greater than (e.g., at least 10% greater than) the hardness of the substrate. For instance, the layer hardness can be at least 10, 20, 30, 40 or 50% greater than the substrate hardness. An example layer can have a Berkovich indenter hardness for an indentation that is shallower than 100 nm of at least 10 GPa, e.g., a Berkovich indenter hardness of between 10 and 30 GPa.

A Young's modulus of the layer can be in the range of 50 to 200 GPa, e.g., from 60 to 100 GPa or from 100 to 200 GPa. In further embodiments, a Young's modulus of the layer can be greater than 200 GPa.

In embodiments, the layer is a non-porous, dense or substantially-dense layer. With respect to its theoretical density, the layer can have a relative density of at least 70%, e.g., at least 80% or 90%. In embodiments, the density of the layer is from about 70-90% of its theoretical density.

In one or more embodiments, the layer can be characterized as amorphous or having an x-ray amorphous structure. In one or more specific embodiments, the layer includes a crystalline fraction of about 20 vol. % or less or, alternatively, is free of crystalline fraction(s). The layer may include a crystalline fraction of about 18 vol. % or less, about 16 vol. % or less, about 14 vol. % or less, about 12 vol. % or less, about 10 vol. % or less, about 8 vol. % or less, about 6 vol. % or less, about 4 vol. % or less, about 2 vol. % or less, about 1 vol. % or less, and all ranges and sub-ranges therebetween. In one or more embodiments, the x-ray amorphous layer may have uniform characteristics when compared to crystalline or polycrystalline materials. For illustrative purposes, polycrystalline materials include crystals that are grown or formed having different directions based on how atoms are deposited onto the underlying surface. These different crystal grown orientations that create the polycrystalline materials formed as layers can cause portions of the polycrystalline layer to chip and flake off when a force is applied thereto or when the polycrystalline layer is scratched.

In one or more alternative embodiments, at least a portion of the layer can be a single crystalline layer and/or a polycrystalline layer. Such single crystalline layers and/or polycrystalline layers may be referred to as sub-layers within the layer. In one variant, the crystalline sub-layer and/or polycrystalline sub-layer may be disposed between the amorphous portions of the layer. In other words, the amorphous portions of the layer may form amorphous sub-layers on top of and underneath the crystalline layer and/or polycrystalline layer. Single crystal sub-layers may be provided, for example, using the layer transfer process. Polycrystalline sub-layers may be formed as deposited thin films. Polycrystalline sub-layer may comprise equiaxed crystal grains. Within the crystalline and/or polycrystalline sub-layers, the plurality of grains may be randomly oriented or have a preferred orientation. A polycrystalline sub-layer may, in certain embodiments, include an amorphous fraction. The crystalline content in such polycrystalline materials can be at least 50%, e.g., at least 50, 60, 70, 80, 90 or 95%. For example, a polycrystalline sub-layer can have a crystalline content in the range of 50-80%.

Polycrystalline sub-layers may be characterized by their grain size. In embodiments, the average grain size in a polycrystalline sub-layer can be greater than 10 microns. In further embodiments, the grain size is greater than 50 nm and can include grains over a range of about 200 nm to 5000 nm.

The layer can be CTE-matched with the glass substrate. In embodiments, the layer has a coefficient of thermal expansion that differs from the coefficient of thermal expansion of the glass substrate by at most 10 ppm, the CTE difference is less than 10 or 5 ppm. In embodiments, a difference in the coefficient of thermal expansion between the layer and the glass substrate is between 5 and 10 ppm.

For transferred single-crystal sapphire layers, for example, the coefficient of thermal expansion is isotropic in the basal (c-axis) plane. Thus, in addition to providing a-axis, m-axis or r-axis sapphire, a transferred sapphire layer may comprise c-axis material.

The layer can be under a state of compressive stress. A slightly compressive stress can improve resistance to crack propagation within or through the layer. In embodiments where the layer is under a state of compressive stress, an absolute value of the stress (which is conventionally negative for compression and positive for tension) can be between 10 and 500 MPa.

The layer may, according to some embodiments, have a coefficient of friction in the range of 0.1 to 0.8, e.g., 0.1 to 0.3 or 0.3 to 0.8. Example coefficient of friction values for the layer include 0.1, 0.2, 0.3, 0.4, 0.5, 0.6, 0.7 and 0.8.

The outward-facing surface of the layer can be textured but, in embodiments, the outward-facing surface is a smooth, planar surface that may be characterized by a root-mean-square (rms) roughness over an area of 1 $\mu m^2$ of less than 100 nm, e.g., from 5 to 100 nm. In embodiments the rms surface roughness of the layer is less than 5 nm.

As noted above, the layer may be provided directly onto a surface of the glass substrate. Alternatively, the layer may be provided onto a previously surface-modified glass substrate. If included, one or more intervening layers between the layer and the glass substrate may include an anti-reflective layer, an anti-sparkle layer, an anti-glare layer and an adhesion-promoting layer.

The optical properties of the layer can be tailored to minimize scattering and absorption of light, which can result in a high optical-quality glass article. In applications where the glass substrate is used as display cover glass, the layer can be optically clear (e.g., water clear) and optically transparent. For example, the layer can have a refractive index within the visible spectrum of less than about 3, e.g., from about 1.4 to 2, from about 1.45 to 1.55, or from about 1.7 to 2.8, and a reflectance within the visible spectrum of less than 40%, e.g., less than 40, 30, 20, 10 or 5%. The refractive index of the layer can be substantially equal to the refractive index of the glass substrate.

In embodiments, the layer can transmit greater than 70% of incident light, e.g., at least 70% or 80%. For instance, the layer can transmit between 80 and 90% of incident light. In further embodiments, the layer can transmit 95% or more of incident light, e.g., at least 95, 96, 97, 98 or 99%. A water clear layer transmits greater than 98% of incident light.

In addition to the optical transparency of the layer, which can facilitate its use within a display glass cover, the layer can be transparent to radio frequencies. In embodiments, the radio frequency (RF) transparency of the layer can be at least 50%. For example, the RF transparency of the layer can be 50, 60, 70, 80, 90 or 95%. The layer can be substantially free of scratches, including microductile scratches.

Figure 3:
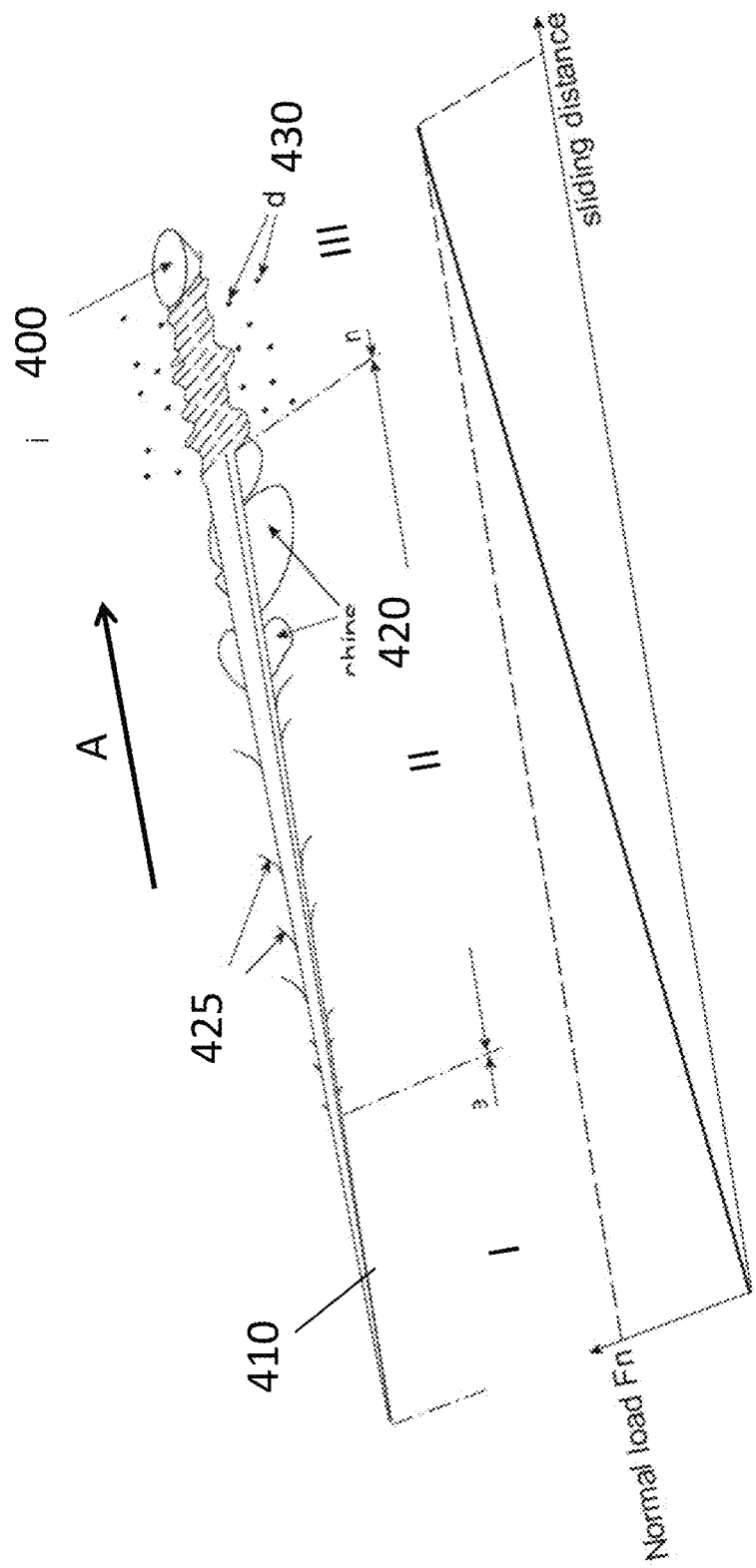
FIG. 3 is a schematic showing scratch formation in a glass surface under a monotonic loading cycle.
Figure 4:
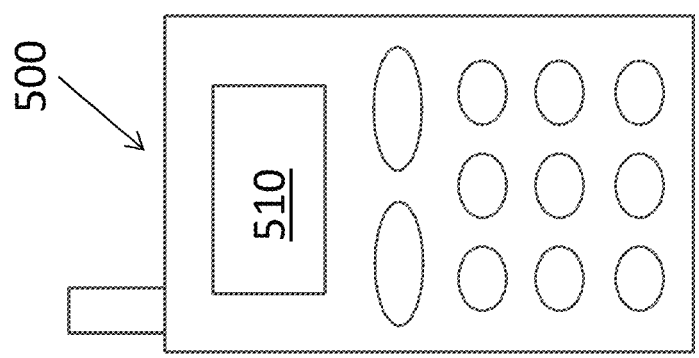
FIG. 4 is a top view of a mobile electronic device having a cover plate formed of a scratch-resistant glass according to various embodiments.

The loading cycle applied during scratch-resistance testing typically gives rise to three different response regimes. The scratch pattern made on a glass surface as a function of applied load is shown schematically in FIG. 3. Arrow A in FIG. 3 indicates the direction of scratching. The first regime is the micro-ductile regime (I), which corresponds to plastic deformation under the indenter 400 and the appearance of a permanent groove 410. In this first regime, sub-surface lateral cracks may also appear. A characteristic of the micro-ductile regime is the absence of damage or debris on either side of the groove 410. The second regime (II), which is encountered when the load increases, is called the micro-cracking regime. Chip and fragment 420 formations occur in the micro-cracking regime as a consequence of the intersection of lateral cracks with the surface. Radial (chevron) cracks 425 may also form in the micro-cracking regime. Such cracking can dramatically affect the optical transparency of the glass. The third regime (III) is termed the micro-abrasive regime, and is characterized by the formation of bulk debris 430.

In one or more embodiments, glass substrates having a modified surface (e.g., to include a layer, as described herein) may exhibit a scratch width and/or scratch depth reduction, when such glass substrates are scratched using a Berkovich indenter at various loads, when compared to glass substrates without such a layer (or bare glass substrates). Such loads may simulate use of electronic devices incorporating such glass substrates therein. For example, such loads may include 60 mN, 120 mN and/or 160 mN. The scratch depth of scratches created using a Berkovich indenter at such loads may be reduced by as much as 60%, when compared to glass substrates that do not include a layer (or bare glass substrates) and that are scratched in an identical manner. In one or more embodiments, the scratch depth of such glass substrates including a layer may be reduced by 35% or more, or 40% or more or even 60% or more, after being scratched using Berkovich indenter under a 160 mN load, 120 mN load and 60 mN load, respectively, when compared to glass substrates without such a layer (or bare glass substrates). In one or more embodiments, the scratch width may similarly be improved when the glass substrate is modified to include a layer as described herein. For example, the scratch width may be reduced by at least 35% when such glass substrates are scratched using a Berkovich indenter under a 60 mN, 120 mN or even 160 mN load, when compared to glass substrates that do not include such a layer (or bare glass substrates).

Technologies that incorporate glass articles that may benefit from scratch resistance include military and civilian optics, including watch crystals, scanner windows at grocery stores, scanner windows on photocopiers, and LCD screen protectors, hard disk memory surfaces, piston rings in engines, machine tools, and other moving and sliding components.

A mobile electronic device comprising a cover plate, at least a portion of which is transparent, is also disclosed. Such mobile electronic devices include, but are not limited to, mobile communication devices such as personal data assistants, mobile telephones, pagers, watches, radios, laptop computers and notebooks, and the like. As used herein, a "cover plate" refers to a glass sheet or window that covers a visual display. At least a portion of the cover plate is transparent to allow viewing of the display. The cover plate may to some extent be resistant to shock, breakage, and scratching and finds application in those electronic devices where a window having high surface strength, hardness, and scratch resistance is desirable. In one embodiment, the cover plate is touch sensitive.

Figure 5:
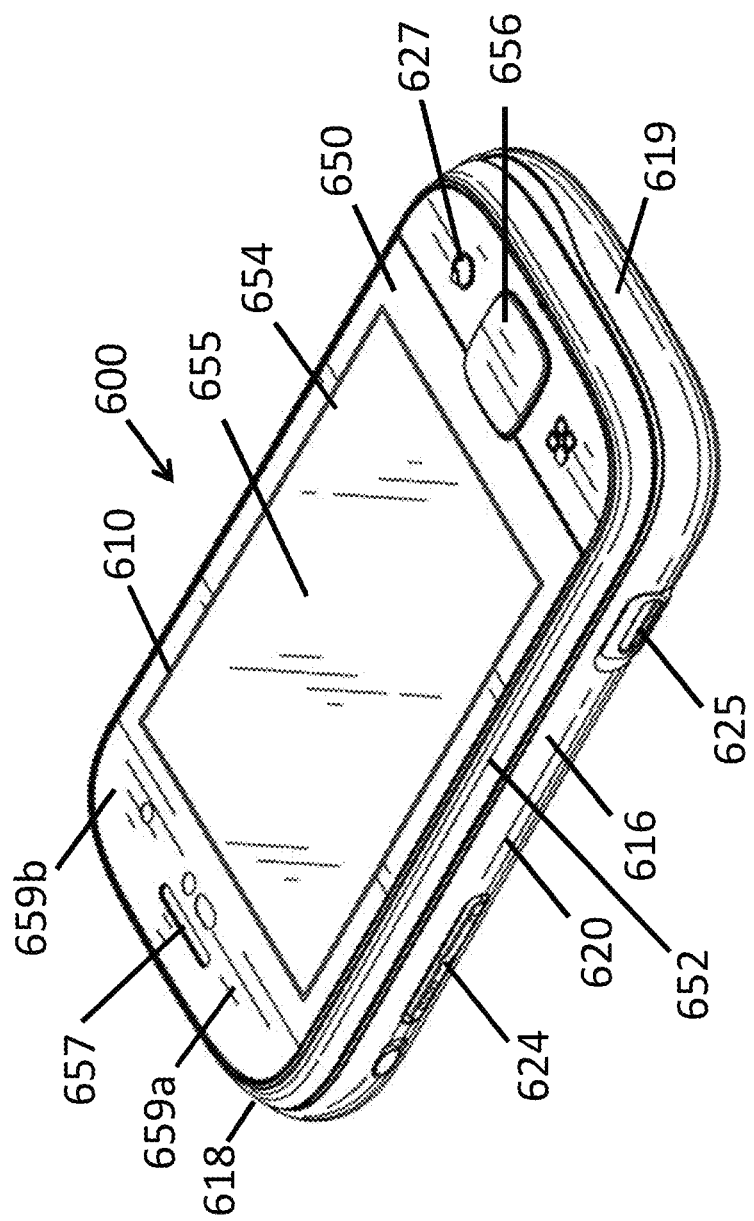
FIG. 5 is a view of an electronic device structure according to various embodiments.

A schematic representation of a top view of a mobile telephone is shown in FIG. 5. Mobile telephone 500 includes a cover plate 510 comprising a surface-modified glass substrate as described herein. In mobile telephone 500, cover plate 510 serves as a display window. During formation of the cover plate, a sheet of down-drawn glass can be cut to the desired shape and size. Before or after sizing the cover plate, the glass sheet may be strengthened by ion exchange, and then provided with an inorganic, scratch-resistant layer over an exposed surface of the glass. The cover plate may then be joined to the body of the mobile electronic device using an adhesive or other means known in the art.

A cover plate for a device such as, but not limited to, the mobile electronic devices described above as well as non-electronic watches and other like, is also provided. The cover plate may be formed from any of the glass compositions disclosed herein above.

Presently-disclosed embodiments also relate to a housing for an electronic device. In embodiments, an electronic device housing can have one or more outer members (e.g., exposed major surfaces), such as front or back surfaces, that are formed of glass. The one or more glass surfaces can be part of outer member assemblies that can be secured to other portions of the electronic device housing.

As an electronic device housing, one embodiment can, for example, include at least a front glass cover placed and secured to provide a front surface for the electronic device enclosure and a back glass cover placed and secured to provide a back surface for the electronic device enclosure.

As shown in FIG. 5, electronic device 600 includes an outer periphery member 620 that surrounds the periphery of electronic device 600 to define some or all of the outer-most side, top, and bottom surfaces (e.g., surfaces 610, 616, 618 and 619) of the electronic device. Outer periphery member 620 can have any suitable shape, and can enclose an inner volume of the device in which electronic device components can be assembled and retained.

In some embodiments, outer periphery member 620 can include one or more openings, knobs, extensions, flanges, chamfers, or other features for receiving components or elements of the device. The features of the outer periphery member can extend from any surface of the outer periphery member, including for example from internal surfaces or from external surfaces. In particular, outer periphery member 620 can include a slot or opening 624 for receiving a card or tray. Opening 624 can be aligned with one or more internal components operative to receive and connect to an inserted component (e.g., an inserted SIM card). As another example, outer periphery member 620 can include connector opening 625 (e.g., for a 30-pin connector) through which a connector can engage one or more conductive pins of electronic device 600. Further, outer periphery member 620 can include opening 627 for providing audio to a user (e.g., an opening adjacent to a speaker), or receiving audio from a user (e.g., an opening adjacent to a microphone).

To retain components within the inner volume, electronic device 600 can include front cover assembly 650 and back cover assembly (not shown) providing the front and back surfaces of the electronic device, respectively. Each cover assembly can be coupled to outer periphery member 620 using any suitable approach, including for example using an adhesive, tape, mechanical fastener, hooks, tabs, or combinations thereof. In some embodiments, one or both of cover assemblies can be removable, for example for servicing or replacing electronic device components (e.g., a battery). In some embodiments, cover assemblies can include several distinct parts, including for example a fixed part and a removable part.

In the illustrated example, front cover assembly 650 can include support structure 652 on which glass substrate 654 is assembled. Support structure 652 can include one or more openings, including an opening through which display 655 can be provided. In some embodiments, support structure 652 and glass substrate 654 can include openings for device components, such as button opening 656 and receiver opening 657.

The glass substrate 654 can include a surface-modified glass substrate as disclosed herein. By way of example, the housing can include one or both of a front outer glass substrate that provides a front surface for the housing (as shown) and a back glass substrate that provides a back surface for the housing. The electronic device can be portable and in some cases handheld.

In some embodiments, glass substrate 654 can include a cosmetic finish hiding from view internal components of the electronic device. For example, an opaque layer can be applied to peripheral regions of the glass substrate surrounding display 655 to hide from view the non-display portions of the display circuitry. Because one or more sensors may receive signals through glass substrate 654, the opaque layer can be selectively removed, or selected to allow signals to pass through the glass plate to the sensor behind the plate. For example, glass substrate 654 can include regions 659a and 659b through which sensors (e.g., a camera, infrared sensor, proximity sensor, or ambient light sensor) can receive signals.

As used herein, the singular forms "a," "an" and "the" include plural referents unless the context clearly dictates otherwise. Thus, for example, reference to a "layer" includes examples having two or more "layers" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

The following examples represent certain non-limiting embodiments of the disclosure.

Example 1 and Comparative Example 2 were prepared to illustrate the scratch depth and scratch width reduction exhibited by a glass main body with and without the layer, disposed thereon. Three samples each of Example 1 were prepared by providing three chemically-strengthened glass main bodies each having opposing main surfaces and forming a layer comprising silicon-oxynitride on one main surface of each sample. The layer had a thickness of 2.6 μm. The layer was deposited via ion assist DC sputtering process using a DC Magnetron system. The layer was sputtered from a target at a pressure of about 0.5 mTorr in the presence of argon flowed at a rate of about 60 sccm, with DC power supplied at 6 kW. The ion beam was generated at a power of 0.18 kW using a mixture of nitrogen and oxygen gases. Three samples each of Comparative Example 2 were prepared by providing three chemically-strengthened glass main bodies having the same compressive stress and compressive stress layer thicknesses as the glass main bodies utilized in the samples of Example 1. Each of the samples of Example 1 and Comparative Example 2 were scratched at three different loads using a Berkovich indenter. For the samples of Example 1, the side of the glass main body including the layer was scratched. The width and depth of the scratch on each of the samples were measured and are provided in Table 1.

TABLE 1

Scratch loads and width and depth measurements.

| Sample | | Width (μm) | Depth (nm) | Width Reduction | Depth Reduction |
|---|---|---|---|---|---|
| Example 1 | 1 (160 mN load) | 5.44 | 217 | 38.5% | 35.6% |
| Comparative Example 2 | 1 (160 mN load) | 8.84 | 337 | | |
| Example 1 | 2 (120 mN load) | 4.57 | 155 | 34.2% | 43.2% |
| Comparative Example 2 | 2 (120 mN load) | 6.95 | 273 | | |
| Example 1 | 3 (60 mN load) | 2.67 | 53 | 37.3% | 63.44% |
| Comparative Example 2 | 3 (60 mN load) | 4.26 | 145 | | |

FIG. 6 shows Atomic Force Microscopy (AFM) images of the samples of Example 1 and Comparative Example 2, after each sample was scratched.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a glass substrate that comprises a glass material include embodiments where a glass substrate consists of a glass material and embodiments where a glass substrate consists essentially of a glass material.

It will be apparent to those skilled in the art that various modifications and variations can be made to the present disclosure without departing from the spirit and scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An electronic device housing, comprising:
   at least one of (a) a front glass cover placed and secured to provide a front surface for the electronic device enclosure, and (b) a back glass cover placed and secured to provide a back surface for the electronic device enclosure, wherein the front glass cover and the back glass cover comprise a glass substrate,
   wherein the glass substrate comprises:
      a glass main body having opposing major surfaces; and
      a layer having a thickness provided over a majority of a first major surface, wherein at least a portion of the thickness of the layer comprises a Berkovich indenter hardness of at least 10 GPa and an x-ray amorphous structure, and wherein the layer comprises at least one attribute selected from the group consisting of:
         an optical transparency of at least 70%; and
         a compressive stress of at least 10 MPa.

2. The electronic device housing according to claim 1, wherein the layer comprises both attributes selected from the group.

3. The electronic device housing according to claim 1, wherein the layer comprises a Berkovich indenter hardness ranging from 10 GPa to 30 GPa.

4. The electronic device housing according to claim 1, wherein the layer has an optical transparency ranging from 70% to 90%.

5. The electronic device housing according to claim 1, wherein the thickness of the layer is in the range from about 50 nm to about 200 nm.

6. The electronic device housing according to claim 1, wherein the thickness of the layer is in the range from about 50 nm to about 2 μm.

7. The electronic device housing according to claim 1, wherein the layer has a compressive stress ranging from 10 MPa to 500 MPa.

8. The electronic device housing according to claim 1, wherein the layer has a crystalline fraction of about 20 vol. % or less.

9. The electronic device housing according to claim 8, wherein the layer is substantially free of any crystalline fraction.

10. The electronic device housing according to claim 1, wherein the layer is a contiguous layer.

11. The electronic device housing according to claim 1, wherein the layer is provided in direct physical contact with the glass substrate.

12. The electronic device housing according to claim 1, wherein one or more of an anti-reflective layer, anti-sparkle layer, anti-glare layer and an adhesion-promoting layer are provided between the glass substrate and the layer.

13. The electronic device housing according to claim 1, wherein the layer has a refractive index of less than about 3 at visible wavelengths.

14. The electronic device housing according to claim 1, wherein the layer has a refractive index between about 1.7 and 2.8 at visible wavelengths.

15. The electronic device housing according to claim 1, wherein the layer has a reflectance of less than about 40% at visible wavelengths.

16. The electronic device housing according to claim 1, wherein the layer is water clear.

17. The electronic device housing according to claim 1, where the layer is substantially free of micro ductile scratches.

18. The electronic device housing according to claim 1, wherein the glass substrate has a thickness ranging from about 100 microns to 5 mm.

19. The electronic device housing according to claim 1, wherein the glass substrate comprises chemically-strengthened glass.

20. The electronic device housing according to claim 1, wherein the layer comprises a metal oxide, a metal nitride, a metal carbide, a metal boride, diamond-like carbon or a combination thereof.

21. The electronic device housing according to claim 19, wherein the metal is selected from the group consisting of B, Al, Si, Ti, V, Cr, Y, Zr, Nb, Mo, Sn, Hf, Ta and W.

22. An electronic device housing, comprising:
   at least one of (a) a front glass cover placed and secured to provide a front surface for the electronic device enclosure, and (b) a back glass cover placed and secured to provide a back surface for the electronic device enclosure, wherein the front glass cover and the back glass cover comprise a glass substrate,
   wherein the glass substrate comprises:
      a glass main body having opposing major surfaces; and
      a layer having a thickness provided over a majority of a first major surface, wherein at least a portion of the thickness of the layer comprises a Berkovich indenter hardness of at least 10 GPa and an x-ray amorphous structure, and
      wherein the glass substrate exhibits a scratch width reduction, when scratched using a Berkovich indenter and a load of at least 60 mN, of at least 35%, when compared to a glass main body without the layer provided over a majority of a first major surface.

23. An electronic device housing, comprising:
   at least one of (a) a front glass cover placed and secured to provide a front surface for the electronic device enclosure, and (b) a back glass cover placed and secured to provide a back surface for the electronic device enclosure, wherein the front glass cover and the back glass cover comprise of glass substrate,
   wherein the glass substrate comprises:
      a glass main body having opposing major surfaces; and
      a layer having a thickness provided over a majority of a first major surface, wherein at least a portion of the thickness of the layer comprises a Berkovich indenter hardness of at least 10 GPa and an x-ray amorphous structure, and wherein the glass substrate exhibits a scratch depth reduction, when scratched using a Berkovich indenter and a load of up to about 160 mN, of at least 35%, when compared to a glass main body without the layer provided over a majority of a first major surface.

* * * * *